United States Patent [19]

Kanazawa

[11] Patent Number: 5,018,089
[45] Date of Patent: May 21, 1991

[54] LOGIC SIMULATION METHOD AND APPARATUS

[75] Inventor: Kiyoshi Kanazawa, Katano, Japan

[73] Assignee: Matsushita Electric Industrial Co., Ltd., Osaka, Japan

[21] Appl. No.: 319,319

[22] Filed: Mar. 6, 1989

[30] Foreign Application Priority Data

Mar. 10, 1988 [JP] Japan .................................. 63-56615

[51] Int. Cl.$^5$ ........................ G06F 15/60; G06F 15/22
[52] U.S. Cl. .................................... 364/578; 364/488; 371/23
[58] Field of Search ............... 364/526, 488, 490, 200, 364/900, 300; 371/23, 17, 27; 340/705

[56] References Cited

U.S. PATENT DOCUMENTS

| | | | |
|---|---|---|---|
| 4,527,249 | 7/1985 | Van Brunt | 371/23 |
| 4,644,487 | 2/1987 | Smith | 364/578 |
| 4,675,832 | 6/1987 | Robinson et al. | 364/488 |
| 4,751,637 | 6/1988 | Catlin | 364/200 |
| 4,860,291 | 8/1989 | Damm et al. | 371/27 |
| 4,901,260 | 2/1990 | Lubachevsky | 371/23 |
| 4,945,503 | 7/1990 | Takasaki | 377/23 |

Primary Examiner—Parshotam S. Lall
Assistant Examiner—Ellis B. Ramirez
Attorney, Agent, or Firm—Stevens, Davis, Miller & Mosher

[57] ABSTRACT

Determining the operation of a logic circuit through calculation is generally called logic simulation. Especially, in event driven type logic simulation, signal status changes at input and output terminals of an element of the logic circuit are deemed as events and only for an element in which an event occurs at its input terminal, the signal status at its output terminal is calculated. In the event driven type logic simulation, a series of signal status changes externally applied to the logic circuit is stored, as injection events, in a memory of a logic simulation apparatus. If injection events are all stored in the memory before execution of the simulation or injection events are stored in the memory by temporarily stopping the simulation after start thereof, most of memory capacity is consumed by the injection events or simulation speed is degraded. To solve this problem, an identifier (called color) is added to an event and when an injection event is injected, the injected event is associated with auxiliary time representing a minimum of values of event times of injection events expected to be injected after injection of that injected event. Color and auxiliary time are used to permit execution of the simulation in parallel with injection of injection events.

4 Claims, 11 Drawing Sheets

FIG. 11 a | T1 | S1 | OTHERS 1 | C1 | t1 | D1 | b | T1 | S1 | OTHERS 1 | C1 | t1 | c | T1 | S1 | OTHERS 1 | d | T2 | S2 | OTHERS 2 | e | T2 | S2 | OTHERS 2 | C2 | f | T3 | S3 | OTHERS 3 | C3 | t3 | D3 |

FIG. 12

| | | | | | |
|---|---|---|---|---|---|
| g | T5 | S5 | OTHERS 5 | D5 | t5 |

| | | | | |
|---|---|---|---|---|
| h | T5 | S5 | OTHERS 5 | D5 |

| | | | | |
|---|---|---|---|---|
| i | T5 | S5 | OTHERS 5 | C5 |

| | | | |
|---|---|---|---|
| j | T5 | S5 | OTHERS 5 |

| | | | |
|---|---|---|---|
| k | T6 | S6 | OTHERS 6 |

| | | | | |
|---|---|---|---|---|
| m | T6 | S6 | OTHERS 6 | C6 |

| | | | | | |
|---|---|---|---|---|---|
| n | T7 | S7 | OTHERS 7 | C7 | D7 |

FIG. 14

| R1 | Y4 | Y4 |
|----|----|----|
|    | Y3 | Y3 |
|    | Y2 | Y2 |
|    | R1 |    |
| (A)| (B)| (C)|

LOGIC SIMULATION METHOD AND APPARATUS

BACKGROUND OF THE INVENTION

This invention relates to a logic simulation method and apparatus used for verifying the operation of a logic circuit and more particularly to an event driven type logic simulation method and apparatus.

In the event driven type logic simulation, the change in status of a signal in a logic circuit to be simulated is deemed as an occurrence of an event and a series of signal status changes is handled as a series of events. Data representative of an event contains "event time" data indicative of the time that the signal status changes, "post-status" data indicative of a signal status after a change and "additional information" data indicative of a logic element number in which the signal status changes.

Also, in the event driven type simulation, only a logic element which experiences a signal status change at its input terminal is considered such that a signal status at its output terminal is calculated. When calculation results of calculation indicate that the signal status at the output terminal changes, an event to this effect is newly created and transmitted to an input terminal of a succeeding logic element connected to the output terminal of the preceding logic element. If calculation results indicate that the signal status at the output terminal does not change, no new event is created.

The event driven type logic simulation is executed by repeating three processes which include a process for evaluating an event representative of a signal status change at an input terminal of a logic element and calculating events representative of signal status changes at an output terminal of the logic element ("evaluation process"), a process for deciding/extracting an event deserving evaluation from a group of events calculated in the evaluation process ("take-out process") and a process for transmitting an event representative of a signal status change at the output terminal of the logic element to an input terminal of a succeeding logic element connected to the output terminal of the preceding logic element ("transmission process").

In deciding an event deserving evaluation, a method as described in "Design II of VLSI", Iwanami Lectureship, Microelectronics, pp. 191-210 is employed wherein an event which has a minimum of values of event times of all events in the logic simulation apparatus and which represents a signal status change at the input terminal of a logic element is decided to deserve elevation. In other words, this method sequentially evaluates events, starting from an event having a smaller (earlier) event time, and calculates a signal status at the output of a logic element relating to an evaluated event.

Recently, in order to speed up simulation, a system is provided wherein a processor is managed to carry out the take out process, evaluation process and transmission process through pipeline processing or a plurality of processors for pipeline processing are grouped in a logic simulation processor unit and the logic simulation processors are arranged in parallel and operated for parallel processings.

Typically, in the simulation apparatus, a current time output unit for indicating the current time is provided, an event having an event time coincident with the current time is decided to deserve elevation, and the current time is incremented by one when the event relating to the current time disappears in the logic simulation processor.

Updating of the current time must be done in such a manner that updated current time should not exceed not only event time of an event generated through the take-out process, evaluation process and transmission process but also event time of an event or "injection event" representative of a signal status change which is externally applied to the logic circuit to be simulated.

Accordingly, in the prior art logic simulation apparatus, all injection events are stored in an event storage unit of the logic simulation processor in advance of execution of the simulation or the simulation is temporarily stopped each time that current time is advanced to some extent, injection events each having an event time which is slightly greater than the current time are injected into the logic simulation processor and after completion of storage by the logic simulation processor of all the injection events in the event storage unit, the simulation is restarted.

The prior art logic simulation method and apparatus however face the following problems.

More particularly, in the prior art logic simulation method and apparatus in which all of the injection events are stored in the event storage unit in advance of execution of the simulation, there arises a problem in that memory capacity of the event storage unit is consumed greatly by the injection events.

Secondly, in the prior art logic simulation method and apparatus in which the simulation is temporarily stopped each time that a current time is advanced to some extent, injection events each having an event time which is slightly greater than the current time are injected into the logic simulation processor and after completion of storage of all the injection events in the event storage unit of the logic simulation processor, the simulation is restarted, there arises a problem in that simulation speed is degraded.

SUMMARY OF THE INVENTION

The present invention contemplates elimination of the prior art drawbacks and it is an object of a logic simulation method and apparatus according to the invention to prevent the current time from exceeding event times of injection events, by injecting an injection event to a logic simulation processor in parallel with execution of simulation.

It is another object of a logic simulation method and apparatus according to the invention to avoid processing of an event other than an injection event from retarding, by storing the injection event in an event storage unit.

To accomplish the above objects, the invention is constructed as described below.

According to the logic simulation method and apparatus of the invention, an event injection unit adds to an event an identifier for discriminating an event generated through a take-out process, an evaluation process and a transmission process from an injection event at that delivers an injection event together with an auxiliary time representative of the event time of an injection event expected to be delivered out of the event injection unit after delivery of that delivered injection event, a time storage unit stores the auxiliary time corresponding to an injection event stored in an event storage, and a current time output unit updates the current time within a range of values stored in the time storage unit.

Buffer memories provided in a logic simulation processor store events in accordance with the kind of identifier.

According to the logic simulation method and apparatus of the invention, an identifier is used which discriminates an event generated through a take-out process, an evaluation process and a transmission process from an injection event, an event injection unit delivers, when delivering an injection event, an auxiliary time representing a minimum of values of event times of injection events expected to be delivered out of the event injection unit after delivery of that delivered injection event, a time storage unit stores the auxiliary time corresponding to an injection event stored in an event storage unit at the time of the storage of the stored injection event, and a current time output unit updates the current time within a range of values stored in the time storage unit, whereby the injection event can be stored in the event storage unit in parallel with execution of simulation.

Buffer memories provided in a logic simulation processor store events in accordance with the kind of identifier associated therewith, and an event generated through a take-out process, an evaluation process and a transmission process is preferentially taken out of one of the buffer memories, thereby preventing processing of the event generated through an evaluation process and a transmission process from being slowed down in the presence of an injection event.

BRIEF DESCRIPTION OF THE DRAWINGS

FIGS. 11 and 12 are diagrams showing the structure of events;

FIG. 14 shows at sections (A) to (C) the change of color of events.

DESCRIPTION OF THE PREFERRED EMBODIMENTS

The invention will now be described by way of example with reference to the accompanying drawings.

A created event obtained through the take-up process, evaluation process and transmission process is discriminated from an injection event by using an identifier called "color" and the term color will be used hereinafter.

Figure 1:
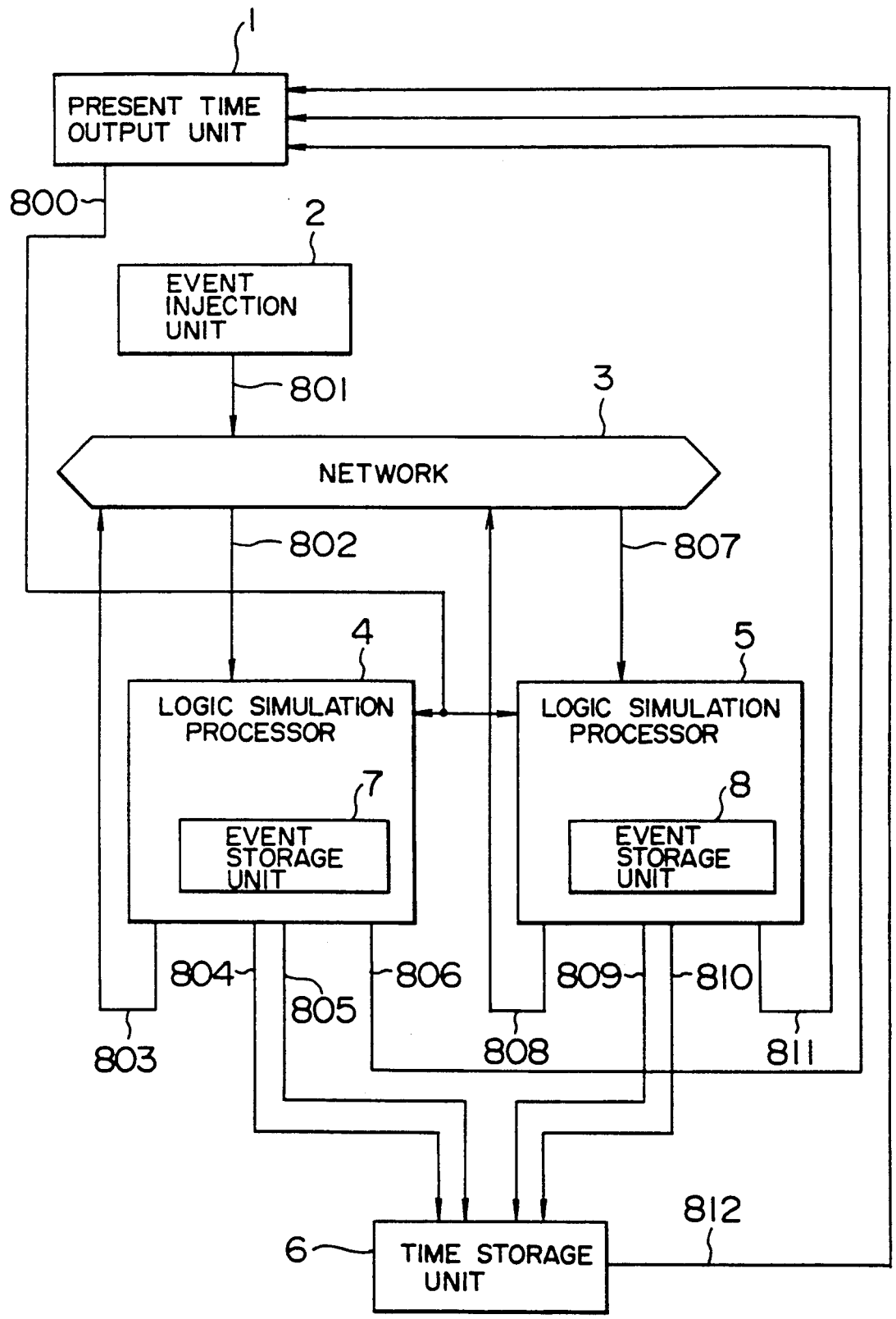
FIG. 1 is a block diagram showing the construction of a first embodiment of a logic simulation apparatus according to the invention.

FIG. 1 is a schematic block diagram illustrating a first embodiment of a logic simulation apparatus according to the invention. The apparatus shown in FIG. 1 comprises a current time output unit 1, an event injection unit 2, a network 3, logic simulation processors 4 and 5, a time storage unit 6 and event storage units 7 and 8. Denoted by 800, 801, 802, 803, 804, 805, 806, 807, 808, 809, 810, 811 and 812 are signal lines.

A first example of structures of data or events processed by the logic simulation apparatus of the invention is shown in FIG. 11. Individual events a, b, c, d, e and f shown in FIG. 11 have event time T1, T2 or T3, post-status S1, S2 or S3, additional information OTHERS 1, OTHERS 2 or OTHERS 3, color C1, C2 or C3, auxiliary time t1 or t3 and destination identifier D1 or D3.

The current time output unit 1 delivers current time onto the signal line 800. The initial value of the present time is zero. It is assumed here that the current time is T2.

The event injector 2 stores a set of injection events each having event time, post-status, additional information, color, destination identifier and auxiliary time. The auxiliary time represents a the minimum one of the values of event times of events which are delivered onto the signal line 801 after delivery of a particular event from the event injection unit. An algorithm for calculation of auxiliary time will be described later. Separate calculation of auxiliary times is carried out for individual destination identifiers of injection events. Any injection event is identified by red color.

For convenience of explanation, the following description will be given on the assumption that one of the injection events is represented by the event a (FIG. 11) having event time T1 where $T1 \geq T2$, post-status S1, additional information OTHERS 1, color C1, destination identifier D1 and auxiliary time t1. The event injector 2 delivers the event a onto the signal line 801.

The network 3 receives the event a from the signal line 801 and it delivers the event b identical to the event a, with its destination identifier D1 removed, onto the signal line 802 when the destination identifier D1 designates the logic simulation processor 4 but onto the signal line 807 when the destination identifier D1 designates the logic simulation processor 5.

As an example, the following description will be given on the assumption that the destination identifier D1 designates the logic simulation processor 4.

The logic simulation processor 4 has the event storage unit 7 for storing events. When the logic simulation processor 4 receives the event b from the signal line 802, it removes the color C1 and auxiliary time t1 from the event b to form the event c which in turn is temporarily stored in the event storage 7. When the color C1 of the event b is red, the logic simulation processor 4 delivers, concurrently with storage of the event c in the event storage unit 7, the auxiliary time t1 of the event b to the signal line 804 and a time store signal to the signal line 805. If the master event not removed of color from which the event to be stored originates has a color which is not red, the logic simulation processor 4 does not deliver any output signal to the signal lines 804 and 805 at the time of storage of the event in the event storage unit 7.

The logic simulation processor 4 is also operable to read current time on the signal line 800 so as to take out of the event storage 7 one of the stored events having event time T2 coincident with the current time, that is, the event d having post-status S2 and additional information OTHERS 2. Then, the logic simulation processor 4 adds blue color C2 to the event d to form event e, calculates a signal status change which is caused, in the logic circuit to be simulated, by a signal status change represented by the event e, and delivers to the signal line 803 calculation results in the form of the event f having event time T3, post-status S3 and additional information OTHERS 3. Any value may be set in auxiliary time t3 of the event f. The logic simulation processor 4 makes the destination identifier D3 of the event f an identifier of a logic simulation processor which should process the event f. The logic simulation processor 4 always makes blue the color of an event delivered to the signal line 803. Therefore, the color C3 of the event f is blue. The event c stored in the event storage 7 is taken out thereof when the current time coincides with T1. Also, the logic simulation processor 4 delivers a true value output signal to the signal line 806 when an event having blue color exists in the processor 4 or an event having an event time coincident with the current time exists in the event storage 7 but a false value output signal to the signal line 806 when an event having blue color does not exist in the processor 4 or an event having an event time coincident with the current time does not exist in the event storage 7.

In the foregoing description, the procedures through which the logic simulation processor 4 first receives the event b and ultimately delivers the event f have been described sequentially but the logic simulation processor 4 may process a plurality of events simultaneously through pipeline processing.

If the destination identifier D1 of the event a designates not the logic simulation processor 4 but the logic simulation processor 5, the logic simulation processor 5 receives the event b from the signal line 807 and, like the logic simulation processor 4, removes the color C1 and auxiliary time t1 from the event b to form the event c which in turn is stored in the event storage 8. The processor 5 is also operable to take out of the event storage 8 an event having an event time coincident with the current time and deliver to the signal line 808 an event representative of calculation results and having blue color. If the master event not removed of color from which the stored event originates has red color, the processor 5 delivers, concurrently with storage of the event in the event storage unit 8, the auxiliary time of the master event to the signal line 809 and a time store signal to the signal line 810. Also, the processor 5 delivers a true value signal to the signal line 811 when an event having blue color exists in the processor 5 or an event having an event time coincident with the current time exists in the event storage 8 but a false value signal to the signal line 811 when an event having blue color does not exist in the processor 5 or an event having an event time coincident with the current time does not exist in the event storage 8.

The logic simulation processors 4 and 5 connected in parallel with each other can be operated independently to perform parallel processing.

The network 3 receives the event from the signal line 803 or 808, that is, the event f. When the destination identifier D3 designates the logic simulation processor 4, the network 3 delivers to the signal line 802 an event identical to the event f removed of the destination identifier D3 and when the destination identifier D3 designates the logic simulation processor 5, it delivers the same event to the signal line 807.

The logic simulation processor 4 or 5 again receives that event, calculates the operation of the logic circuit to be simulated and delivers to the signal line 803 or 808 an event representative of results of calculation and having blue color.

The time storage unit 6 stores the value on the signal line 804 when receiving the time store signal from the signal line 805 and the value on the signal line 809 when receiving the time store signal from the signal line 810, and delivers to the signal line 812 the one of the values ultimately stored in the time storage from the signal lines 804 and 809 which is not larger than the other.

The current time output unit 1 starts to update the current time when both of the signal lines 806 and 811 assume false values and increases the current time one by one as long as the current time is smaller than the value on the signal line 812 and the values on the signal lines 806 and 811 both assume false values. When the current time coincides with the value on the signal line 812 or at least one of the values on the signal lines 806 and 811 assumes the true value, the current time output unit 1 stops updating the current time.

In the logic simulation apparatus of the present embodiment, the injection event delivered out of the event injection unit 2 has red color until it is stored in the event storage 7 or 8 of the logic simulation processor 4 or 5, and the event including a first event once stored in the event storage and taken out thereof and a second event resulting from processing of the first event has blue color to distinguish the injection event from the latter event by using color. In addition, a minimum one of the values of event times of injection events expected to be stored in the event storage in the future is stored in the time storage unit 6 in order to limit the range of updating of the current time to below the value stored in the time storage, thereby ensuring that even in the presence of an event having red color in the logic simulation processor, updating of the current time can be started whenever an event having blue color exists in the logic simulation processor and no event having event time coincident with the current time exists in the event storage.

In the logic simulation apparatus of the present embodiment, the logic simulation processor 4 delivers the true value to the signal line 806 when a blue event exists in the processor 4 or an event having event time coincident with the current time exists in the event storage 7 and it delivers the false value to the signal line 806 when no blue event exists in the processor 4 or no event having event time coincident with the current time exists in the event storage 7. As an alternative, all of pipeline stages excepting the event storage in the logic simulation processor may be provided with comparators to compare the event time of an event in each pipeline stage with the current time, thereby permitting the logic simulation processor 4 to deliver the true value to the signal line 806 when a blue event having event time coincident with the current time exists in the processor 4 or an event having event time coincident with the present time exists in the event storage 7 and to deliver the false value to the signal line 806 when no blue event having event time coincident with the current time exists in the processor 4 or no event having event time coincident with the current time exists in the event storage 7. This is true for the logic simulation processor 5. Since in this modification the current time can be updated even during processing of the blue event by the logic simulation processor, speed-up of simulation can be promoted.

Figure 13:
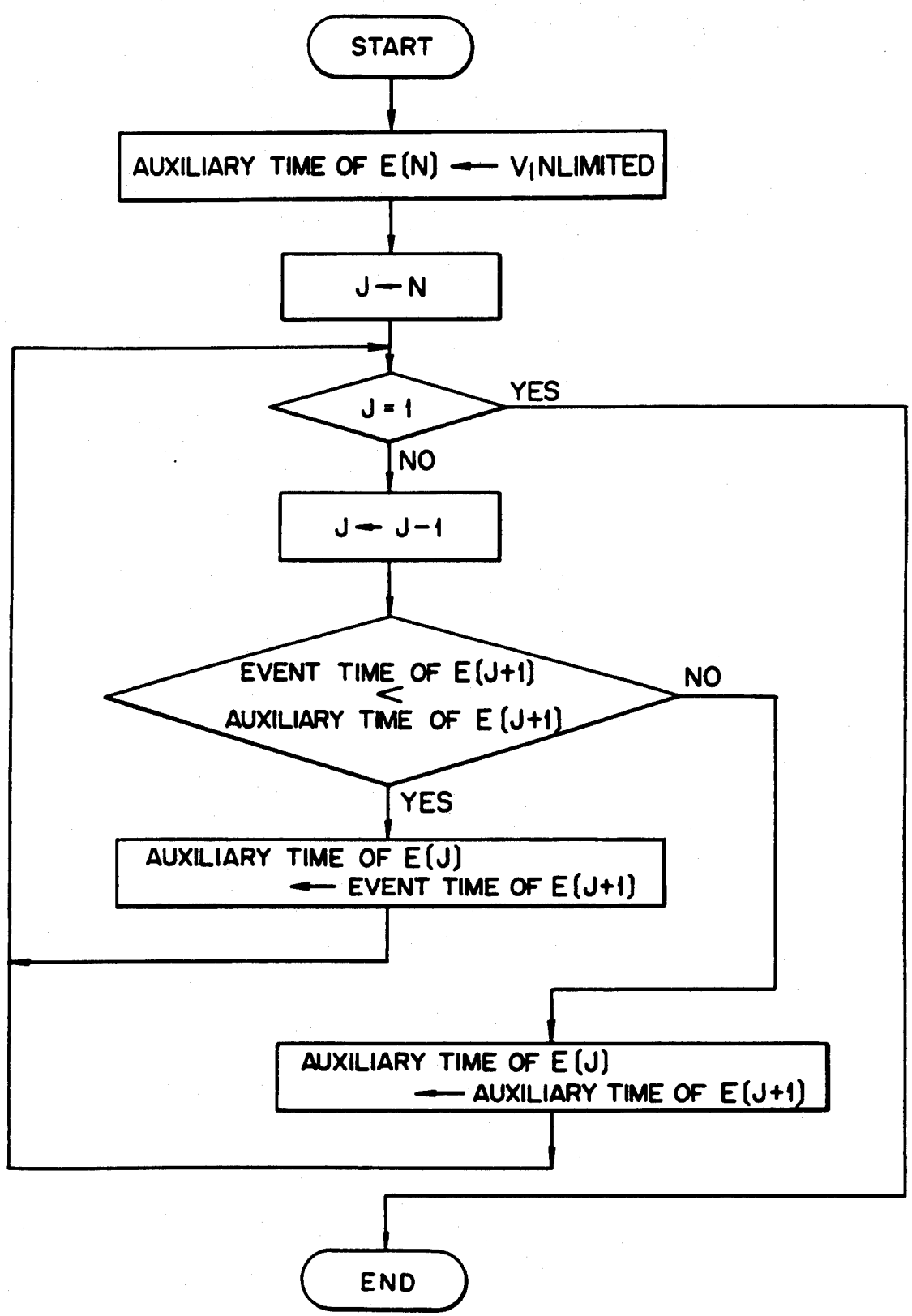
FIG. 13 is a flow chart useful to explain a method of calculating an auxiliary time.

FIG. 13 is a flow chart showing an example of an algorithm for calculation of auxiliary time.

The number of injection events is represented by N and injection events are designated by E[1] to E[N] in sequence of injection.

Auxiliary times of the event E[N], E[N−1], E[N−2], ..., E[2] and E[1] are sequentially calculated as described below.

Firstly, the auxiliary time of the event E[N] is set to be an unlimited value which is the largest of event times of any events. Subsequently, the auxiliary time of event E[j], where j is variable, is set to one of the auxiliary time of event E[j+1] and event time of the same event E[j+1] which is larger than the other while designating individual events by sequentially decreasing the value of variable j from N−1 to 1.

Using this algorithm, auxiliary times of all the injection events E[1] to E[N] can be calculated in the order proportional to the number N of the injection events.

Figure 2:
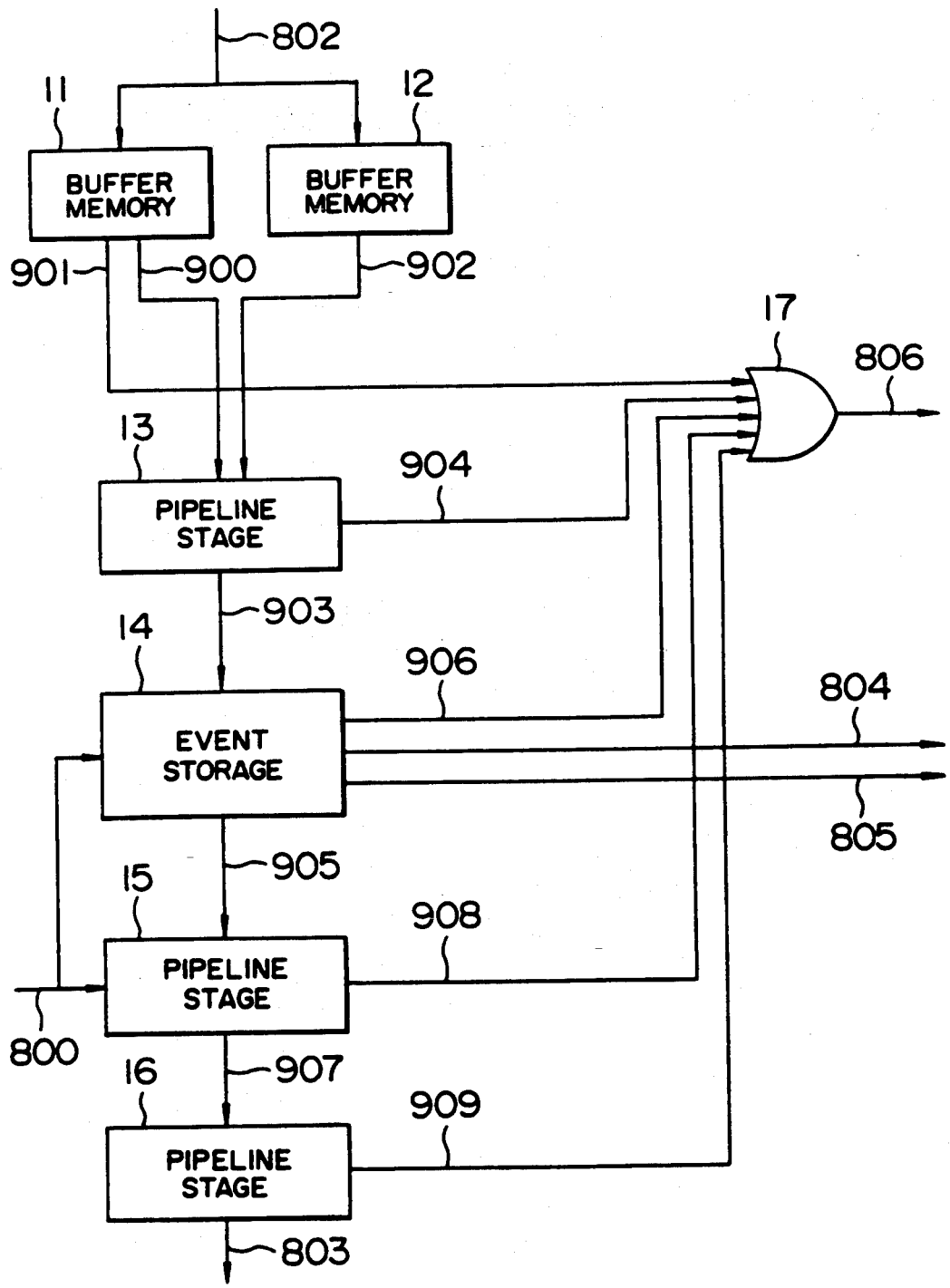
FIG. 2 is a block diagram showing the construction of a first embodiment of a logic simulation processor.

FIG. 2 schematically illustrates a first embodiment of the logic simulation processor according to the invention. Referring to FIG. 2, the processor comprises buffer memories 11 and 12, pipeline stages 13, 15 and 16, an event storage 14 and an OR gate 17. Denoted by 900, 901, 902, 903, 904, 905, 906, 907, 908, 909, 800, 802, 803, 804, 805 and 806 are signal lines.

The buffer memory 11 can store a plurality of events and it receives an event having blue color from the signal line 802 to store it temporarily. The buffer memory 11 delivers to the signal line 900 stored events in sequence of storage. The buffer memory 11 is also operable to deliver the true value to the signal line 901 when an event exists in the memory 11 and to deliver the false value to the signal line 901 when no event exists in the memory 11.

The buffer memory 12 can store a plurality of events and it receives an event having red color from the signal line 802 to store it temporarily. The buffer memory 12 delivers to the signal line 902 stored events in sequence of storage.

The pipeline stage 13 receives events from the signal lines 900 and 902 and delivers to the signal line 903 received events without alteration. When the pipeline stage 13 is ready to receive events from both of the signal lines 900 and 902, it preferentially receives an event on the signal line 900. The pipeline stage 13 is also operable to deliver the true value to the signal line 904 when a blue event exists in the stage 13 and deliver the false value to the signal line 904 when no blue event exists in the stage 13.

As an example, the following description will be given on the assumption that the event b shown in FIG. 11 is delivered to the signal line 903.

The event storage 14 receives the event b from the signal line 903, removes the color C1 and auxiliary time t1 from the event b to form the event c and stores the event c while erasing the event b. When the color C1 of the event b was red, the event storage 14 delivers the auxiliary time t1 of the event b to the signal line 804 and the time store signal to the signal line 805. When the color C1 of the event b was blue, the event storage 14 delivers no signal to both either of the signal lines 804 and 805. The event storage 14 is also operable to read current time on the signal line 800 so as to deliver the true value to the signal line 906 when an event having event time coincident with the current time exists in the storage 14 and deliver the false value to the signal line 906 when no event having event time coincident with the current time exists in the storage 14.

Given a current time of T2, the pipeline stage 15 reads the current time on the signal line 800, takes out of the event storage 14 through the signal line 905 one of the events having event time T2 coincident with the current time, that is, the event d, delivers to the signal line 907 the event e equal to the event d added with blue color C2 and erases the event d. The pipeline stage 15 is also operable to deliver the true value to the signal line 908 when an event exists in the stage 15 and deliver the false value to the signal line 908 when no event exists in the stage 15.

The pipeline stage 16 receives the event e from the signal line 907, performs evaluation processing and transmission processing to calculate a signal status change in the logic circuit to be simulated which is caused by a signal status change represented by the event e, and delivers to the signal line 803 the event f representative of the results of this calculation. The event e is then erased. The pipeline stage 16 always makes blue an event delivered to the signal line 803. The pipeline stage 16 is also operable to deliver the true value to the signal line 909 when an event exists in the stage 16 and deliver the false value to the signal line 909 when no event exists in the stage 16.

The OR gate 17 delivers the true value to the signal line 806 when at least one of the values on the signal lines 901, 904, 908 and 909 assumes the true value and delivers the false value to the signal line 806 when all of the values on the signal lines 901, 904, 906, 908 and 909 assume the false value.

In accordance with the logic simulation processor of the present embodiment, the red color of the injection event remains unchanged before the injection event is stored in the event storage and the color of the event including a first event once stored in the event storage and then taken out thereof and a second event resulting from processing of the first event is made blue to distinguish the injection event from the latter event in color, thereby ensuring that when no event having an event time coincident with the current time exists in the event storage and no blue event exists in the buffer memories and individual pipeline stages, the false value can be delivered to the signal line 806 regardless of the presence or absence of a red event in the logic simulation processor.

Also, in the logic simulation processor of the present embodiment, the event is stored in either one of different buffer memories depending on whether the color of the event is red or blue and the blue event is preferentially processed in order that processing of the blue event can be prevented from being slowed down by the presence of the red event.

In this embodiment, the buffer memory 11 delivers the true value to the signal line 901 when an event exists in the memory 11 but the false value when no event exists in the memory 11, the pipeline stage 13 delivers the true value to the signal line 904 when a blue event exists in the stage 13 but the false value when no blue event exists in the stage 13, the pipeline stage 15 delivers the true value to the signal line 908 when an event exists in the stage 15 but the false value when no event exists in the stage 15, and the pipeline stage 16 delivers the true value to the signal line 909 when an event exists in the stage 16 but the false value when no event exists in the stage 16. In an alternative arrangement, the buffer memory 11, pipeline stage 13, pipeline stage 15 and pipeline stage 16 may respectively be provided with internal comparators by which the event time of an event present in each of the above components can be compared with the current time on the signal line 800, whereby the buffer memory 11 may deliver to the signal line 901 the true value when an event having event time coincident with the current time exists in the memory 11 but the false value when no event having event time coincident with the current time exists in the memory 11, the pipeline stage 13 may deliver to the signal line 904 the true value when a blue event having event time coincident with the current time exists in the stage 13 but the false value when no blue event having event time coincident with the current time exists in the stage 13, the pipeline stage 15 may deliver to the signal line 908 the true value when an event having event time coincident with the current time exists in the stage 15 but the false value when no event having event time coincident with the current time exists in the stage 15, and the pipeline stage 16 may deliver to the signal line 909 the true value when an event having event time coincident with the current time exists in the stage 16 but the false signal when no event having event time coincident with the current time exists in the stage 16. The logic simulation apparatus utilizing the logic simulation processor constructed as described above can start, even in the presence of a blue event in the logic simulation processor, updating of the current time when a blue event having an event time coincident with the present time disappears in the logic simulation processor.

Figure 3:
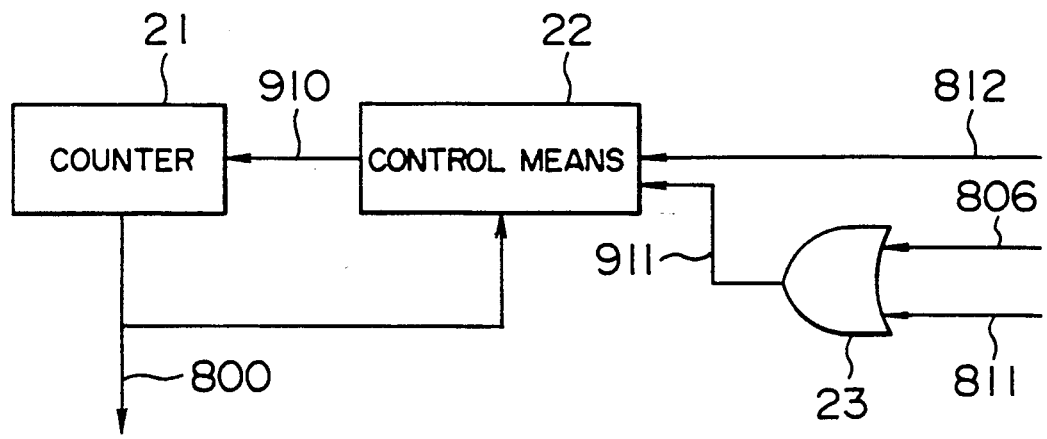
FIG. 3 is a schematic diagram showing the construction of an embodiment of a current time output unit.

FIG. 3 shows the construction of an embodiment of the current time output unit according to the invention. Referring to FIG. 3, the current time output unit comprises a counter 21, a control means 22, and an OR gate 23 with signal lines 910, 911, 800, 806, 811 and 812 connected to the above components.

The OR gate 23 delivers to the signal line 911 the true value when at least one of the signal lines 806 and 811 assumes the true value but the false value when both of the signal lines 806 and 811 assume the false value.

The counter 21 always delivers current time to the signal line 800.

Prior to start of a simulation operation, the control means 22 delivers to the signal line 910 an instruction for initializing the current time. When receiving the current time initialization instruction from the signal line 910, the counter 21 sets the current time to zero.

During execution of the simulation operation, the control means 22 reads values on the signal lines 800, 812 and 911 and delivers an instruction for updating the current time when the value on the signal line 800 is smaller than that on the signal line 812 and the signal line 911 assumes the false value. The control means 22 does not deliver the present time update instruction when the values on the signal lines 800 and 812 are equal to each other or the signal line 911 assumes the true value.

When receiving the current time update instruction from the signal line 910, the counter 21 increments the current time by one.

Figure 4:
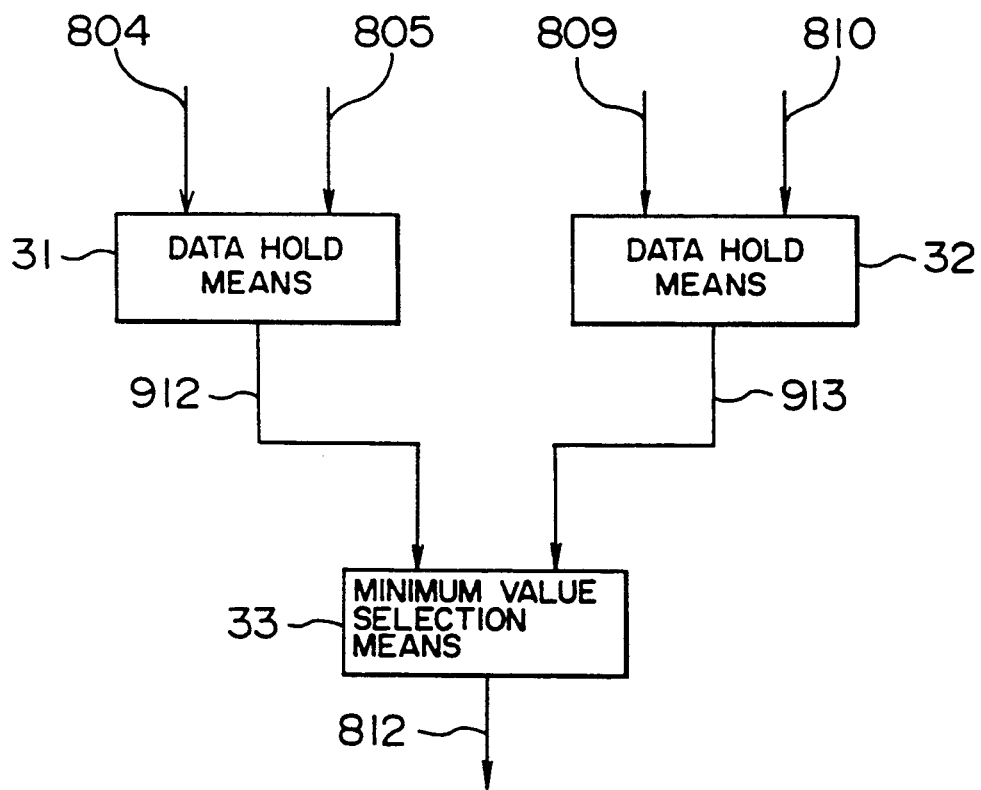
FIG. 4 is a schematic diagram showing the construction of a first embodiment of a time storage unit.

FIG. 4 shows the construction of a first embodiment of the time storage unit according to the invention. Referring to FIG. 4, the time storage unit comprises data hold means 31 and 32 and a minimum value selection means 33 with signal lines 912, 913, 804, 805, 809, 810 and 812 connected to the above components.

The data hold means 31 stores a value on the signal line 804 when receiving a time store signal from the signal line 805 and then delivers a previously stored value to the signal line 912. The data hold means 31 continues to deliver a zero signal to the signal line 912 before it receives the initial time store signal from the signal line 805.

The data hold means 32 stores a value on the signal line 809 when receiving a time store signal from the signal line 810 and then delivers a previously stored value to the signal line 913. The data hold means 32 continues to deliver a zero signal to the signal line 913 before it receives the initial time store signal from the signal line 810.

The minimum value selection means 33 reads the values on the signal lines 912 and 913 and delivers to the signal line 812 the one of the values on the signal lines 912 and 913 which is not larger than the other.

Figure 5:
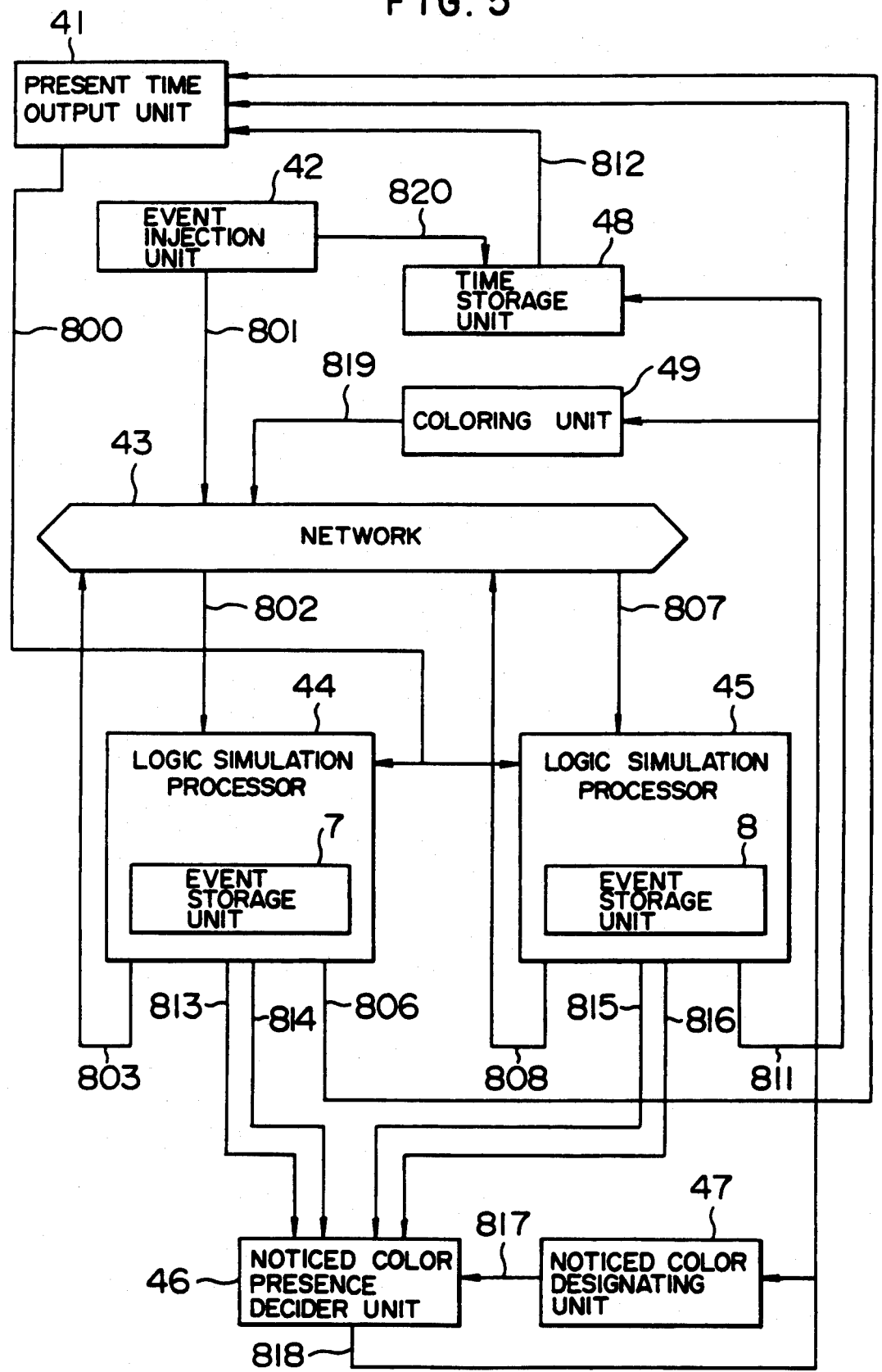
FIG. 5 is a block diagram showing the construction of a second embodiment of the logic simulation apparatus according to the invention.

Referring now to FIG. 5, a second embodiment of the logic simulation apparatus according to the invention is illustrated in schematic block form. The apparatus shown in FIG. 5 comprises a current time output unit 41, an even injection unit 42, a network 43, logic simulation processors 44 and 45, a noticed color presence decider unit 46, a noticed color designating unit 47, a time storage unit 48, a coloring unit 49 and event storage units 7 and 8. Denoted by 800, 801, 802, 803, 806, 807, 808, 811, 812, 813, 814, 815, 816, 817, 818, 819 and 820 are signal lines.

FIG. 12 shows a second example of structures of data or events processed by the logic simulation apparatus of the invention. Individual events g, h, i, j, k, m and n have event time T5, T6 or T7, post-status S5, S6 or S7, additional information OTHERS 5, OTHERS 6 or OTHERS 7, color C5, C6 or C7, destination identifier D5 or D7 and auxiliary time t5.

The current time output unit 41 delivers present time data onto the signal line 800. The initial value of the current time is zero. It is assumed here that the current time is T6.

The event injector 42 stores a set of injection events each having event time, post-status, additional information, destination identifier and auxiliary time calculated pursuant to the algorithm shown in FIG. 13. Auxiliary times are calculated collectively for all injection events regardless of destination identifiers of individual injection events.

For convenience of explanation, the following description will be given on the assumption that one of the injection events is represented by the event g having event time T5 where T5≧T6, post-status S5, additional information OTHERS 5, destination identifier D5 and auxiliary time t5.

The event injector 42 delivers to the signal line 801 the event h identical to the event g removed of the auxiliary time t5 and at the same time it delivers the auxiliary time t5 to the signal line 820. The event injector 42 continues to deliver a zero output signal to the signal line 820 before it delivers the initial injection event to the signal line 801.

The coloring unit 49 selects one of red and yellow colors to deliver to the signal line 819 a C5 value of the selected color. The coloring unit 49 is operable to deliver to the signal line 819 red color as the initial value of color.

The network 43 receives the event h from the signal line 801 and the color C5 from the signal line 819, and when the destination identifier D5 of the event h designates the logic simulation processor 44, it delivers to the signal line 802 the event i identical to the event h removed of the destination identifier D5 but instead having the color C5 added thereto and when the destination identifier D5 designates the logic simulation processor 45, it delivers the event i to the signal line 807.

As an example, the following description will be given on the assumption that the destination identifier D5 designates the logic simulation processor 44.

The logic simulation processor 44 has the event storage unit 7 for storing events. When the logic simulation processor 44 receives the event i from the signal line 802, it removes the color C5 from the event i to form the event j which in turn is temporarily stored in the event storage 7.

The logic simulation processor 44 reads current time from the signal line 800 and takes out of the event storage 7 one of events which has event time T6 coincident with the present time, that is, the event k having the post-status S6 and additional information OTHERS 6. The logic simulation processor 44 adds blue color C6 to the event k to form the event m, calculates a signal status change in the logic circuit to be simulated which is caused by a signal status change represented by the event m, and delivers to the signal line 803 the event n representative of results of calculation and having event time T7, post-status S7 and additional information OTHERS 7. The logic simulation processor 44 is also operable to add destination identifier D7 of the event n which designates a logic simulation processor expected to process the event n. The logic simulation processor 44 always makes the color of an event to be delivered to the signal line 803 blue. Accordingly, color C7 of the event n is blue. The event j stored in the event storage 7 is taken out thereof when current time coincides with T5.

The logic simulation processor 44 is also operable to deliver to the signal line 806 the true value when a blue event exists in the processor 44 or an event having an event time coincident with the current time exists in the event storage 7 but the false value when no blue event exists in the processor 44 or no event having an event time coincident with the current time exists in the event storage 7.

Also, the logic simulation processor 44 is operable to deliver to the signal line 813 the true value when a red event exists in the processor 44 but the false value when no red event exists in the processor 44 and to deliver to the signal line 814 the true value when a yellow event exists in the processor 44 but the false value when no yellow event exists in the processor 44.

In the above description, the procedures through which the logic simulation processor 44 first receives the event i and ultimately delivers the event n have been described sequentially but the logic simulation processor 44 may process a plurality of events simultaneously through pipeline processing.

If the destination identifier D5 of the event h designates not the logic simulation processor 44 but the logic simulation processor 45, the logic simulation processor 45 receives the event i from the signal line 807 and, like the logic simulation processor 44, removes the color C5 from the event i to form the event j which in turn is stored in the event storage 8. The processor 45 is also operable to take out of the event storage 8 an event having an event time coincident with the current time and deliver to the signal line 808 an event representative of calculation results and having blue color. Then, the processor 45 is operable to deliver to the signal line 811 the true value when a blue event exists in the processor 45 or an event having event time coincident with the current time exists in the event storage 8 but the false value when no blue event exists in the processor 45 and no event having event time coincident with the present time exists in the event storage 8. Further, the logic simulation processor 45 delivers to the signal line 815 the true value when a red event exists in the processor 45 but the false value when no red event exists and it delivers to the signal line 816 the true value when a yellow event exists in the processor 45 but the false value when no yellow event exists in the processor 45.

The logic simulation processors 44 and 45 connected in parallel with each other can be operated independently to perform parallel processing.

The network 43 receives the event from the signal line 803 or 808, that is, the event n. When the destination identifier D7 designates the logic simulation processor 44, the network 43 delivers to the signal line 802 an event identical to the event n removed of the destination identifier D7 and when the destination identifier D7 designates the logic simulation processor 45, it delivers the same event to the signal line 807.

The logic simulation processor 44 or 45 again receives that event, calculates the operation of the logic circuit to be simulated and delivers to the signal line 803 or 808 an event representative of the calculation results and having blue color.

The noticed color designating unit 47 selects either one of red and yellow colors to deliver to the signal line 817 the selected color as the noticed color. The initial value of noticed color is yellow.

In response to values delivered from the logic simulation processor 44 to the signal lines 813 and 814, values delivered from the logic simulation processor 45 to the signal lines 815 and 816 and noticed color delivered from the noticed color designating unit 47 to the signal line 817, the noticed color presence decider 46 delivers a color change instruction to the signal line 818 when an event having the noticed color does not exist in any one of the logic simulation processors 44 and 45. The noticed color presence decider 46 does not deliver the color change instruction to the signal line 818 when an event having the noticed color exists in at least one of the logic simulation processors 44 and 45.

When receiving the color change instruction from the signal line 818, the coloring unit 49 changes the color to be delivered to the signal line 819 from red to yellow or vice versa.

The noticed color designating unit 47, also being in receipt of the color change instruction from the signal line 818, changes the noticed color to be delivered to the signal line 817 from yellow to red or vice versa.

When the time storage unit 48 receives the color change instruction from the signal line 818, it reads from the signal line 820 the auxiliary time of the event which the event injector 42 has injected and stores the auxiliary time. The time storage 48 is also operable to deliver to the signal line 812 a value which the time storage 48 has stored from the signal line 820 by responding to a color change instruction one-preceding a color change instruction finally received from the signal line 818. Also, the time storage 48 continues to deliver a zero signal to the signal line 812 before it receives the second occurrence of color change instruction from the signal line 818.

The current time output unit 41 starts to update the current time when both of the signal lines 806 and 811 assume the false value and increments the current time by one as long as the current time is smaller than the value on the signal line 812 and the values on both the signal lines 806 and 811 remain false. The current time output unit 41 stops updating the current time when the current time coincides with the value on the signal line 812 or at least one of the signal lines 806 and 811 assumes the true value.

Figure 14:
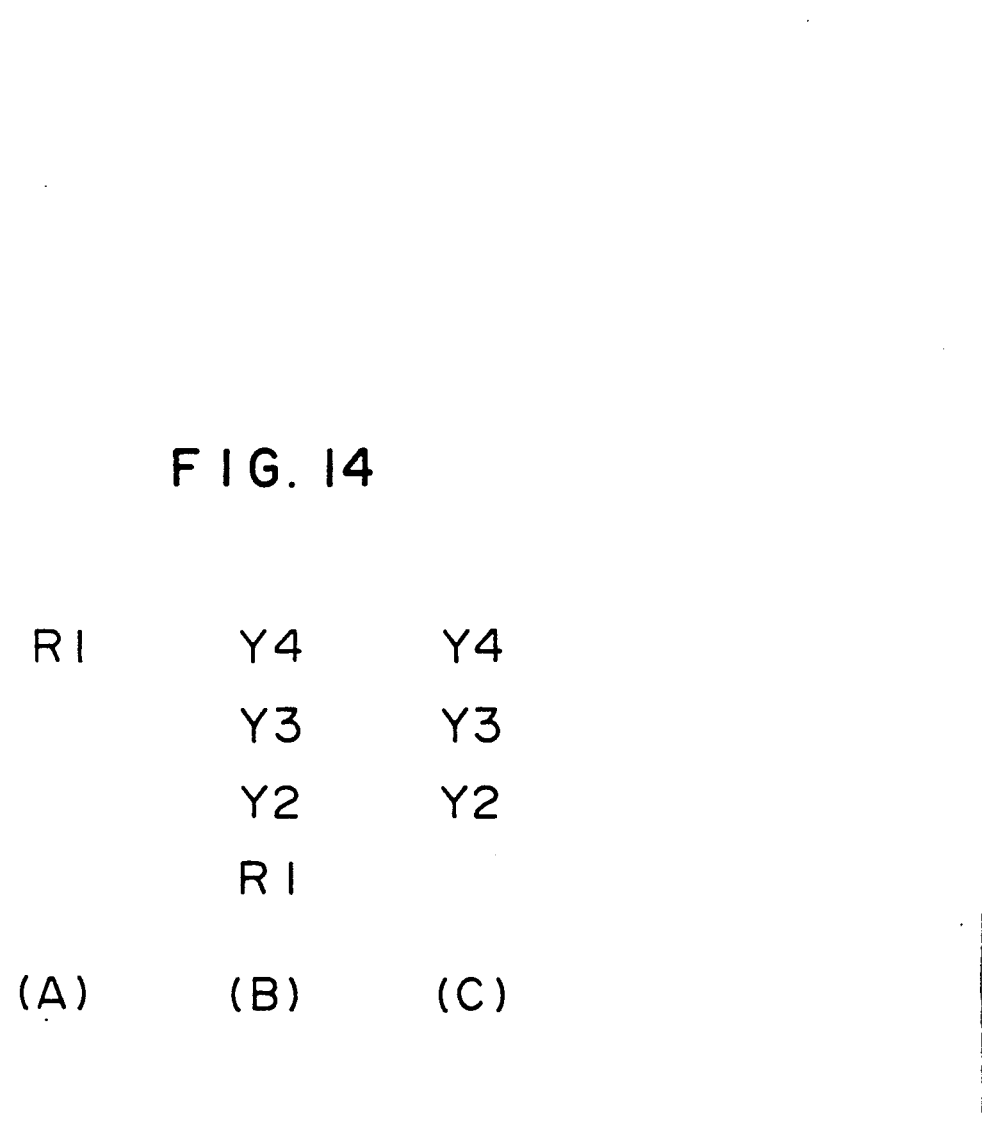

In accordance with the logic simulation apparatus of the second embodiment, the present time never exceeds event times of injection events expected to be stored in the event storage in the future, as will be explained below with reference to sections (A), (B) and (C) in FIG. 14 which is useful to explain the change of color of events used in the logic simulation apparatus of the invention. In FIG. 14, red events are denoted by R1 and yellow events by Y2, Y3 and Y4.

The following description will be given on the assumption that the presence of blue event is omitted and only red and yellow injection events (simply referred to as events except when full terminology is particularly needed) are noticed. When considering the status which occurs before the event injector 42 delivers an injection event to the signal line 801, no event having red or yellow color exists in the logic simulation processor 44 or 45 under this status and the noticed color presence decider 46 delivers to the signal line 818 a color change instruction regardless of the noticed color on the signal line 817.

In response to the color change instruction, the coloring unit 49 changes the color to be delivered to the signal line 819 from red to yellow or vice versa and the noticed color designating unit 47 changes the noticed color to be delivered to the signal line 817 from yellow to red or vice versa. At that time, the time storage unit 48 stores a value on signal line 820 which is zero.

The noticed color presence decider 46 continues to deliver the color change instruction to the signal line 818 until the event injector 42 delivers the initial event to the signal line 801.

Assuming that when the event injector 42 delivers the initial event to the signal line 801, the color delivered from the coloring unit 49 to the signal line 819 is red and the noticed color delivered from the noticed color designating unit 47 to the signal line 817 is yellow, a red event received by the logic simulation processor 44 or 45 is represented by R1. The following description will be given on the assumption that injection events are all received by the logic simulation processor 44 (or 45).

When the event injector 42 delivers the initial injection event to the signal line 801 and the logic simulation processor 44 receives an event R1, the event existing in the logic simulation processor 44 (or 45) is represented by only the red event R1 as shown at (A) in FIG. 14. Accordingly, no event having noticed color exists in the logic simulation processor 44 (or 45) and the noticed color presence decider 46 therefore delivers a color change instruction to the signal line 818, causing the color on the signal line 819 to change to yellow and the noticed color to change to red. The time storage 48 then operates to store the auxiliary time corresponding to the event R1, that is, a minimum of values one of event times of the events delivered to the signal line 801 after the event R1, but the zero value on the signal line 812 remains unchanged.

Thereafter, since the event having the noticed color (red) exists in the logic simulation processor 44 (or 45) before the event storage 7 stores the event R1, no color change instruction is delivered to the signal line 818 and the color on the signal line 819 and the noticed color on the signal line 817 are not changed. Given that during this period, yellow events Y2, Y3 and Y4 are received by the logic simulation processor 44, the events R1, Y2, Y3 and Y4 exist in the logic simulation processor 44 (or 45) as shown at (B) in FIG. 14.

When the event R1 is stored in the event storage 7, only the injection events Y2, Y3 and Y4 exist in the logic simulation processor 44 (or 45) and no event having the noticed color (red) exists as shown at (C) in FIG. 14, a color change instruction is again delivered to the signal line 818, causing the color on the signal line 819 to change to red and noticed color on the signal line 817 to change to yellow. Then, the time storage 48 stores the auxiliary time corresponding to the event Y4 and delivers to the signal line 812 the auxiliary time corresponding to the event R1.

At that time, the upper limit related to the injection events and used to limit the updating of current time obviously corresponds to a minimum of value event times of the events stored in the event storage 7 (or 8) after the event Y2, that is, the value on the signal line 812. Subsequently, the color on the signal line 819, the noticed color on the signal line 817 and the value on the signal line 812 are each changed sequentially in a similar manner to change the upper limit for updating the present time.

As described above, the logic simulation apparatus of the present embodiment can determine the range within which the current time can be updated even when the auxiliary time is removed from an event received by the logic simulation processor.

Therefore, in comparison with the logic simulation apparatus shown in FIG. 1, the logic simulation apparatus of this embodiment can enable reduced data width of events processed by the logic simulation processor and decreased hardware requirements of the logic simulation processor.

The logic simulation apparatus according to the present embodiment is also advantageous in that the auxiliary time which the time storage must store is only the value on the signal line 820.

Figure 6:
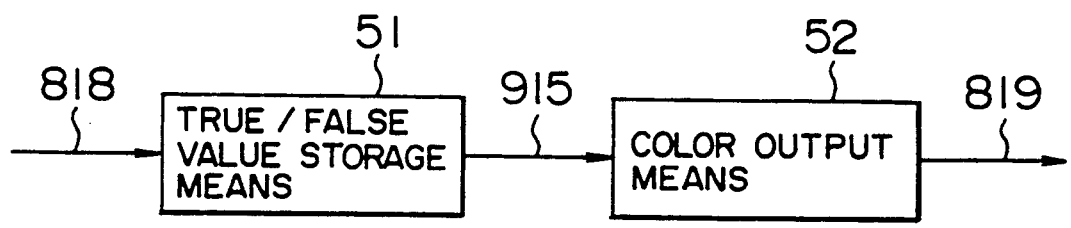
FIG. 6 is a schematic diagram showing the construction of an embodiment of a coloring unit.

FIG. 6 shows the construction of an embodiment of the coloring unit according to the invention. Referring to FIG. 6, the coloring unit comprises a true/false value storage means 51 and a color output means 52 with signal lines 915, 818 and 819 connected to the above components.

The true/false value storage means 51 selects and stores either one of true and false values and it then delivers the stored value to the signal line 915. The true/false value storage means 51 stores the true value as an initial value. When receiving a color change instruction from the signal line 818, the true/false value storage means 51 causes the value stored and then delivered to the signal line 915 to change from a true value to a false value or vice versa.

The color output means 52 reads the value on the signal line 915 and delivers to the signal line 819 red color when the read value is the true value but yellow color when the read value is the false value.

Figure 7:
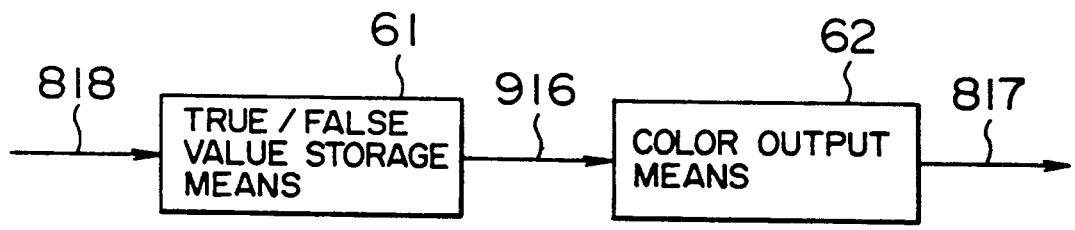
FIG. 7 is a schematic diagram showing the construction of an embodiment of a noticed color designating unit.

FIG. 7 show the construction of an embodiment of the noticed color designating unit according to the invention. Referring to FIG. 7, the noticed color designating unit comprises a true/false value storage means 61 and a color output means 62 with signal lines 916, 817 and 818 connected to the above components.

The true/false value storage means 61 selects and stores either one of true and false values and it then delivers the stored value to the signal line 916. The true/false value storage means 61 stores the true value as an initial value. When receiving a color change instruction from the signal line 818, the true/false value storage means 61 causes the value stored and then delivered to the signal line 916 to change from a false value to a true value or vice versa.

The color output means 62 reads the value on the signal line 916 and delivers to the signal line 817 red color when the read value is the true value but yellow color when the read value is the false value.

Figure 8:
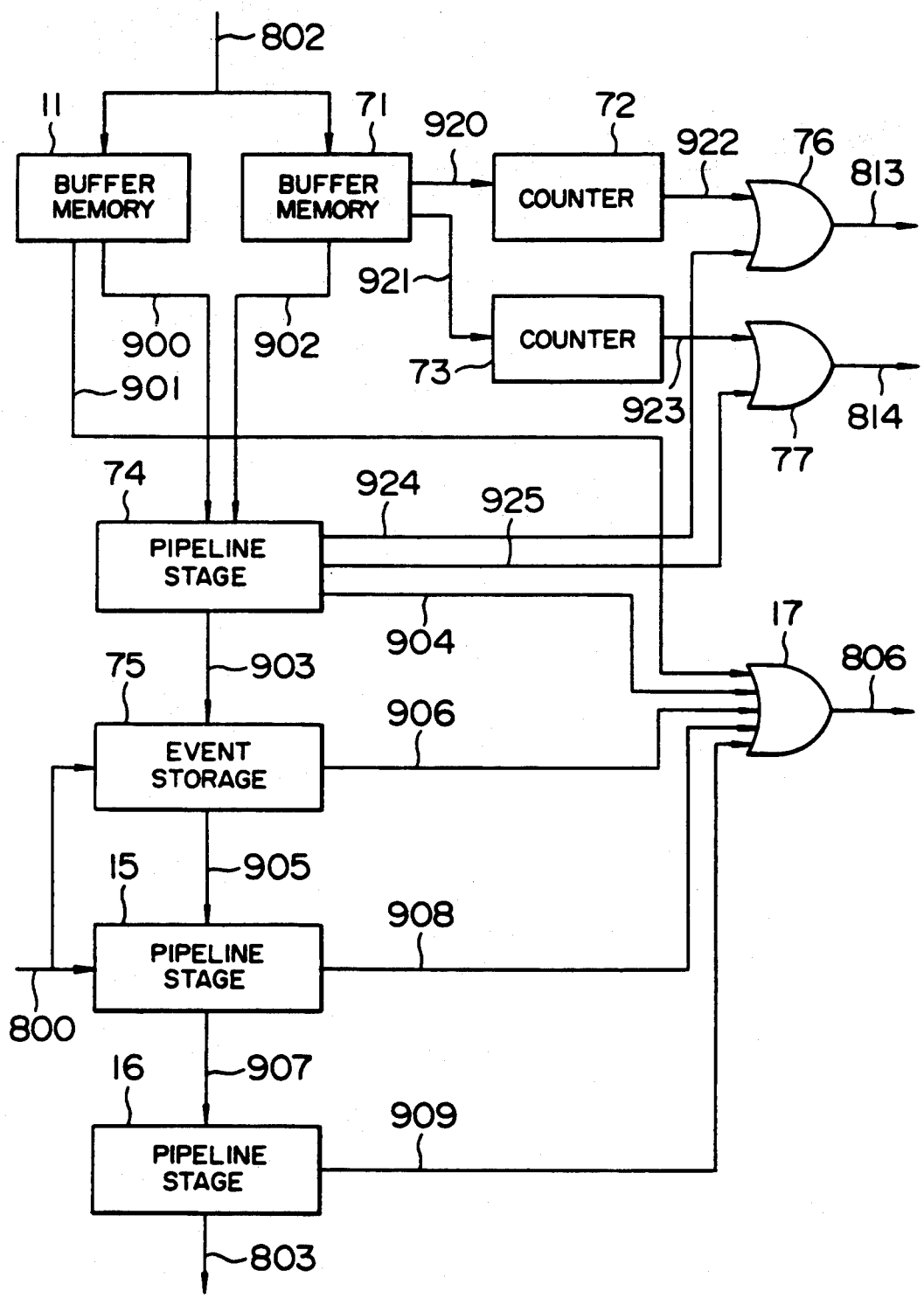
FIG. 8 is a block diagram showing the construction of a second embodiment of the logic simulation processor.

FIG. 8 shows the construction of a second embodiment of the logic simulation processor according to the invention. Referring to FIG. 8, the processor comprises buffer memories 11 and 71, counters 72 and 73, pipeline stages 74, 15 and 16, an event storage 75 and OR gates 17, 76 and 77 with signal lines 900, 901, 902, 903, 904, 905, 906, 907, 908, 909, 920, 921, 922, 923, 924, 925, 800, 802, 803, 806, 813 and 814 connected to the above components.

The buffer memory 11 can store a plurality of events and it receives an event having blue color from the signal line 802 to store it temporarily. The buffer memory 11 delivers to the signal line 900 stored events in sequence of storage. The buffer memory 11 is also operable to deliver the true value to the signal line 901 when an event exists in the memory 11 and to deliver the false value to the signal line 901 when no event exists in the memory 11.

The buffer memory 71 can store a plurality of events and it receives an event having red or yellow color from the signal line 802 to store it temporarily. The buffer memory 71 delivers an addition instruction to the signal line 920 when the color of the event received from the signal line 802 is red but it delivers an addition instruction to the signal line 921 when the color of the event received from the signal line 802 is yellow.

The buffer memory 71 delivers to the signal line 902 stored events in sequence of storage. After delivering an event, the buffer memory 71 delivers a subtraction instruction to the signal line 920 when the delivered event has red color but it delivers a subtraction instruction to the signal line 921 when the delivered event has yellow color.

The counter 72 counts the number of red events stored in the buffer memory 71. The initial value of the count is zero. The counter 72 increments by one the count when receiving the addition instruction from the signal line 920 and decrements by one the count when receiving the subtraction instruction from the signal line 920. The counter 72 is also operable to deliver to the signal line 922 the false value when the count is zero but the true value when the count is not zero.

The counter 73 counts the number of yellow events stored in the buffer memory 71. The initial value of count is zero. The counter 73 increments by one the count when receiving the addition instruction from the signal line 920 and decrements by one the count when receiving the subtraction instruction from the signal line 921. The counter 73 is also operable to deliver to the signal line 923 the false value when the count is zero but the true value when the count is not zero.

The pipeline stage 74 receives events from the signal lines 900 and 902 and delivers to the signal line 903 received events without alteration. When the pipeline stage 74 is ready to receive events from both of the signal lines 900 and 902, it preferentially receives an event on the signal line 900. The pipeline stage 74 is also operable to deliver to the signal line 904 the true value when the event processed by the stage 74 has blue color but the false value when the event processed does not have blue color, delivers to the signal line 924 the true value when the event processed has red color but the false value when the event processed does not have red color and delivers to the signal line 925 the true value when the event processed has yellow color but the false value when the event processed does not have yellow color. When the pipeline stage 74 processes no event, it delivers the false value to all of the signal lines 904, 924 and 925.

As an example, the following description will be given on the assumption that the event i shown in FIG. 12 is delivered to the signal line 903.

The event storage 75 receives the event i from the signal line 903, removes the color C5 from the event i to form the event j and stores the event j while erasing the event i. The event storage 75 is also operable to read current time on the signal line 800 so as to deliver to the signal line 906 the true value when an event having event time coincident with the current time exists in the storage 75 but the false signal when no event having event time coincident with the current time exists in the storage 75.

Given a current time of T6, the pipeline stage 15 reads the current time on the signal line 800, takes out of the event storage 75 through the signal line 905 one of the events having event time T6 coincident with the current time, that is, the event k, delivers to the signal line 907 the event m equal to the event k added with blue color C6 and erases the event k. The pipeline stage 15 is also operable to deliver to the signal line 908 the true value when an event exists in the stage 15 but the false value when no event exists in the stage 15.

The pipeline stage 16 receives the event m from the signal line 907, performs evaluation processing and transmission processing to calculate a signal status change in the logic circuit to be simulated which is caused by a signal status change represented by the event m, and delivers to the signal line 803 the event n representative of results of calculation. The event m is then erased. The pipeline stage 16 always makes blue an event delivered to the signal line 803. The pipeline stage 16 is also operable to deliver to the signal line 909 the true value when an event exists in the stage 16 but the false value when no event exists in the stage 16.

The OR gate 17 delivers to the signal line 806 the true value when at least one of the values on the signal lines 901, 904, 906, 908 and 909 assumes the true value but the false value when all of the values on the signal lines 901, 904, 906, 908 and 909 assume the false value.

The OR gate 76 delivers to the signal line 813 the true value when at least one of the values on the signal lines 922 and 924 assumes the true value but the false value when both of the values on the signal lines 922 and 924 assume the false value.

The OR gate 77 delivers to the signal line 814 the true value when at least one of values on the signal lines 923 and 925 assumes the true value but the false value when the values on the signal lines 923 and 925 both assume the false value.

In accordance with the present embodiment, a logic simulation processor is realized which can deliver signals indicating whether either of events having red color and yellow color exists in its own processor.

In the logic simulation processor of the present embodiment, two buffer memories are provided. Alternatively, however, buffer memories respectively dedicated to red, yellow and blue colors may be provided so that the signal line 922 may receive from a buffer memory for storage of a red event the true value when an event exists in the red event storage buffer memory but the false value when no event exists in the red event storage buffer memory, and the signal line 923 may receive from another buffer memory for storage of a yellow event the true value when an event exists in the yellow event storage buffer memory but the false value when no event exists in the yellow event storage buffer. With this construction, the counters respectively adapted to count the number of events of one color stored in the signal buffer memory and the number of events of different color stored in the same buffer memory may be omitted.

Conversely, a single buffer memory and three counters may be provided in order to count the number of events in different groups stored in the single buffer memory and having different colors. With this construction, the number of buffer memories used can be reduced.

Figure 9:
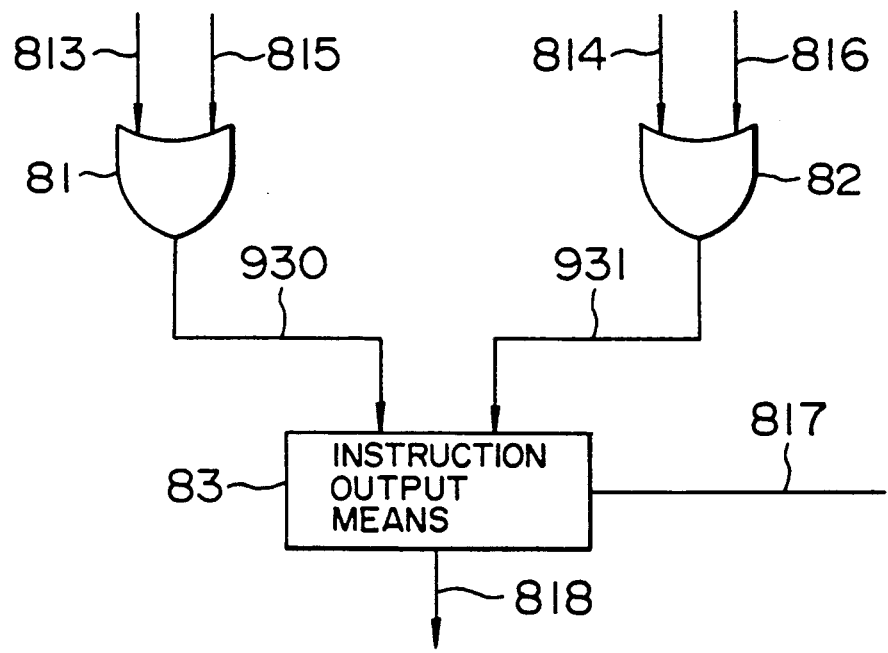
FIG. 9 is a schematic diagram showing the construction of an embodiment of a noticed color presence decider unit.

FIG. 9 shows the construction of an embodiment of the noticed color presence decider according to the invention. Referring to FIG. 9, the noticed color presence decider comprises OR gates 81 and 82 and an instruction output means 83 with signal lines 930, 931, 813 814, 815, 816, 817 and 818 connected to the above components.

The OR gate 81 reads values on the signal lines 813 and 815 and delivers to the signal line 930 the true value when at least one of the values on the signal lines 813 and 815 is the true value but the false value when both of the values on the signal lines 813 and 815 assume the false value.

The OR gate 82 reads values on the signal lines 814 and 816 and delivers to the signal line 931 the true value when at least one of the values on the signal lines 814 and 816 is the true value but the false value when both of the values on the signal lines 814 and 816 assume the false value.

The instruction output means 83 delivers a color change instruction to the signal line 818 when the value on the signal line 817 is red and the value on the signal line 930 is the false value or when the value on the signal line 817 is yellow and the value on the signal line 931 is the false value. Except in the above cases, the instruction output means 83 delivers no color change instruction.

Figure 10:
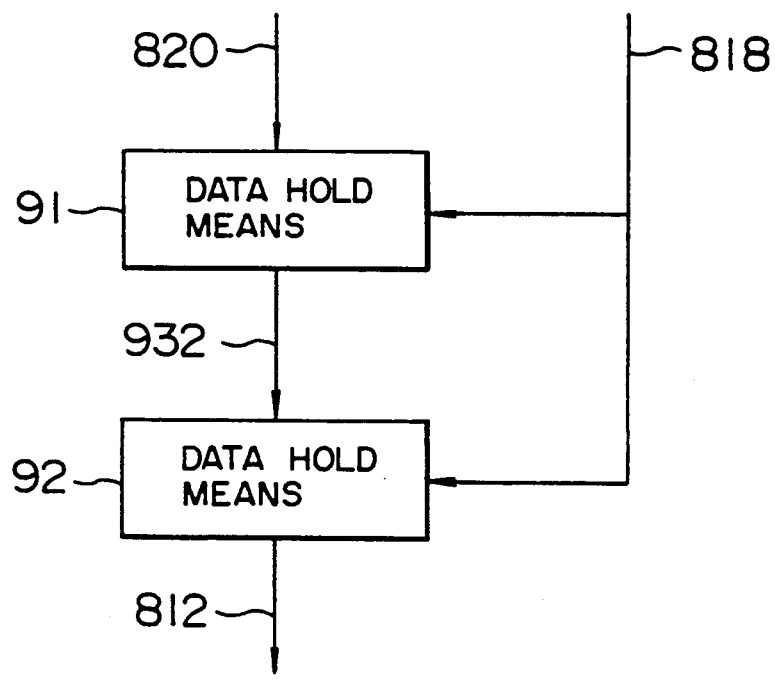
FIG. 10 is a schematic diagram showing the construction of a second embodiment of the time storage unit.

FIG. 10 shows the construction of a second embodiment of the time storage unit according to the invention. Referring to FIG. 10, the time storage unit comprises data hold means 91 and 92 with signal lines 932, 820, 812 and 818 connected thereto.

The data hold means 91 stores a value on the signal line 820 and then delivers a previously stored value to the signal line 932.

The data hold means 92 stores a value on the signal line 932 and then delivers a previously stored value to the signal line 812.

Both of the data hold means 91 and 92 store zero value as initial value.

When receiving a color change instruction from the signal line 818, the data hold means 91 stores a value appearing on the signal line 820 at that time and then delivers a previously stored value to the signal line 932.

When receiving a color change instruction from the signal line 818, the data hold means 92 stores a value which has been delivered from the data hold means 91 to the signal line 932 before storage of a new value by the data hold means 91 and then delivers a previously stored value to the signal line 812.

With this construction, the a time storage unit is realized which can deliver, when receiving a color change instruction from the signal line 818, to the signal line 812 a value appearing on the signal line 820 when a one-preceding color change instruction is received.

I claim:
1. A logic simulation method for simulating operations of a logic circuit comprising a plurality of logic elements by employing an event driven algorithm wherein (1) a set of events represent changes in status of signals at input and output terminals of said logic elements, (2) each event includes (i) element-terminal data indicating an input or output terminal of a logic element to which the event relates, (ii) event time data indicating a time when a status change occurs at the element-terminal and (iii) status data indicating a status to which the signal at the element-terminal changes, (3) an event is determined to be acceptable for current processing according to said algorithm based on coincidence of its said event time data with the current time which occurs when said event relates to a logic element having a changed signal status at its input terminal which causes a change in calculated signal status at its output to be calculated such that an event representing said change in calculated signal status at said output terminal is newly generated according to said algorithm, said method comprising the steps of:
   (a) providing a renewable indication of current time;
   (b) producing a set of events to be applied to input terminals of said logic elements, each of said produced events being provided with an identifier to distinguish it from newly generated events according to said algorithm;
   (c) arranging said produced events in a particular order;
   (d) providing each of said produced events with auxiliary time data indicating a minimum event time of all produced events positioned subsequent thereto in said order;
   (e) distinguishing said produced events from said newly generated events by said identifier;
   (f) storing in an event storage unit each of said produced events successively in said order as unprocessed events and as each of said produced events is stored in said event storage unit, storing its associated auxiliary time data in a time storage unit;
   (g) taking out and deleting from among said unprocessed events stored in said event storage unit an event having associated event time data corresponding to the current time;

(h) processing said event taken out in step (g) and storing in said event storage unit as one of said unprocessed events a said newly generated event caused in the simulated logic circuit by processing said event taken out in step (g);

(i) determining whether an event is stored in said event storage unit which has event time data coincident with the current time;

(j) renewing the current time, responsive to a determination in step (i) that no event is stored in said event storage unit which has event time data coincident with the current time and a determination that said current time is earlier than an item of said auxiliary time data stored in said time storage unit, up to a time not exceeding said auxiliary time data stored in said time storage unit, wherein each of said steps (a)–(j) are executed concurrently.

2. A logic simulation method for simulating operations of a logic circuit comprising a plurality of logic elements by employing an event driven algorithm wherein (1) a set of events represent changes in status of signals at input and output terminals of said logic elements, (2) each event includes (i) element-terminal data indicating an input or output terminal of a logic element to which the event relates, (ii) event time data indicating a time when a status change occurs at the element-terminal and (iii) status data indicating a status to which the signal at the element-terminal changes, (3) an event is determined to be acceptable for current processing according to said algorithm based on coincidence of its said event time data with the current time which occurs when said event relates to a logic element having a changed signal status at its input terminal which causes a change in calculated signal status at its output to be calculated such that an event representing said change in calculated signal status at said output terminal is newly generated according to said algorithm, said method comprising the steps of:

(a) providing a renewable indication of current time;

(b) producing a set of events to be applied to input terminals of said logic elements, each of said produced events being provided with an identifier to distinguish it from newly generated events according to said algorithm;

(c) temporarily storing said produced events in a buffer memory;

(d) preferentially taking out of said buffer memory one of said produced events having a said identifier having a specified value;

(e) storing the event taken out in step (d) in an event storage unit as an unprocessed event;

(f) taking out and deleting from among said unprocessed events stored in said event storage unit an event having associated event time data corresponding to the current time;

(g) processing the event taken out in step (f) according to said algorithm and temporarily storing in said buffer memory an event caused in the simulated logic circuit by said processing of said event taken out in step (f);

(g) determining whether an event is stored in said event storage unit which has event time data coincident with the current time; and (h) renewing the current time, responsive to a determination in step (g) that no event is stored in said event storage unit which has event time data coincident with the current time and a determination that said current time is earlier than an item of said auxiliary time data stored in said time storage unit.

3. A logic simulation apparatus for simulating operations of a logic circuit comprising a plurality of logic elements by employing an event driven algorithm wherein (1) a set of events represent changes in status of signals at input and output terminals of said logic elements, (2) each event includes (i) element-terminal data indicating an input or output terminal of a logic element to which the event relates, (ii) event time data indicating a time when a status change occurs at the element-terminal and (iii) status data indicating a status to which the signal at the element-terminal changes, (3) an event is determined to be acceptable for current processing according to said algorithm based on coincidence of its said event time data with the current time which occurs when said event relates to a logic element having a changed signal status at its input terminal which causes a change in calculated signal status at its output to be calculated such that an event representing said change in calculated signal status at said output terminal is newly generated according to said algorithm, said apparatus comprising:

(a) a current time output unit for outputting a renewable current time indication;

(b) an event injection unit for producing a set of produced events to be applied to input terminals of said logic elements and for arranging said set of produced events in a particular order, each of said produced events representing a change in status of a signal applied to a said input terminal of said logic circuit and being provided with an identifier to distinguish it from newly generated events calculated according to said algorithm and auxiliary time data indicating a minimum event time of all produced events positioned subsequent thereto in said order;

(c) a logic simulation processor employing said algorithm to calculate changes in signal status in said logic circuit responsive to events received from said event injection unit, said processor including (i) an event storage unit for storing events received from said event injection unit as unprocessed events, (ii) means for taking out and deleting from among said unprocessed events stored in said event storage unit an event having an event time data coincident with the current time, (iii) means for processing said taken out event according to said algorithm to output a new event as an unprocessed event to be inputted to said event storage unit of the processor, and (iv) means for determining whether an unprocessed event is stored in said event storage unit which has event time data coincident with the current time; and (d) a time storage unit for storing, when each of said produced events is stored in said event storage unit, its associated auxiliary time data; and wherein said current time output unit includes means for comparing the current time indication with the auxiliary time stored in said time storage unit and means for renewing the current time, responsive to (i) a determination by said deciding means that no event is stored in said event storage unit which has event time data coincident with the current time and (ii) a determination by said comparing means that said current time is earlier than an item of said auxiliary time data stored in said time storage unit, up to a time not exceeding said auxiliary time data stored in said time storage unit, and wherein each of said elements (a)–(d) are operable concurrently.

4. A logic simulation apparatus for simulating operations of a logic circuit comprising a plurality of logic elements by employing an event driven algorithm wherein (1) a set of events represent changes in status of signals at input and output terminals of said logic elements, (2) each event includes (i) element-terminal data indicating an input or output terminal of a logic element to which the event relates, (ii) event time data indicating a time when a status change occurs at the element-terminal and (iii) status data indicating a status to which the signal at the element-terminal changes, (3) an event is determined to be acceptable for current processing according to said algorithm based on coincidence of its said event time data with the current time which occurs when said event relates to a logic element having a changed signal status at its input terminal which causes a change in calculated signal status at its output to be calculated such that an event representing said change in calculated signal status at said output terminal is newly generated according to said algorithm, said apparatus comprising:

(a) a current time output unit for outputting a renewable current time indication;

(b) an event injection unit for producing a set of events to be applied to input terminals of said logic elements and arranging said set of produced events in a particular order, each of said produced events representing a change in status of a signal applied to a said input terminal of said logic circuit and being provided with an identifier to distinguish it from newly generated events according to said algorithm; and (c) a logic simulation processor employing said algorithm to calculate changes in signal status in said logic circuit responsive to events received from said event injection unit, said processor including (i) an event buffer memory means for temporarily storing said produced events received from said event injection unit, (ii) means for preferentially taking out of said event buffer memory means one of said processed events having a said identifier having a specified value, (iii) an event storage unit for storing the event taken out of the buffer memory as one of said unprocessed events, (iv) means for taking out and deleting from among said unprocessed events stored in said event storage unit an event having an event time data coincident with the current time, (v) means for processing said taken out event according to said algorithm to output a new event as an unprocessed event to be inputted to said event storage unit of the processor, and (vi) means for determining whether an unprocessed event is stored in said event storage unit which has event time data coincident with the current time; and wherein said current time output unit includes means for comparing the current time indication with the auxiliary time stored in said time storage unit and means for renewing the current time, responsive to (i) a determination by said deciding means that no event is stored in said event storage unit which has event time data coincident with the current time and (ii) a determination by said comparing means that said current time is earlier than an item of said auxiliary time data stored in said time storage unit, up to a time not exceeding said auxiliary time data stored in said time storage unit.

* * * * *